United States Patent [19]

Widdershoven

[11] Patent Number: 4,864,377
[45] Date of Patent: Sep. 5, 1989

[54] SILICON ON INSULATOR (SOI) SEMICONDUCTOR DEVICE

[75] Inventor: Franciscus P. Widdershoven, Eindhoven, Netherlands

[73] Assignee: U.S. Philips Corp., New York, N.Y.

[21] Appl. No.: 194,765

[22] Filed: May 17, 1988

[30] Foreign Application Priority Data

May 26, 1987 [NL] Netherlands ............. 8701251

[51] Int. Cl.$^4$ ............................................. H01L 29/78
[52] U.S. Cl. ........................... 357/23.8; 357/91; 357/90; 357/23.9; 357/23.7; 357/23.1; 357/23.4
[58] Field of Search ............... 357/23.8, 90, 91, 23.9, 357/23.7, 23.1, 23.4

[56] References Cited

U.S. PATENT DOCUMENTS

| 4,371,955 | 2/1983 | Sasaki | 357/23.7 X |
| 4,454,524 | 6/1984 | Spence | 357/23.1 X |

FOREIGN PATENT DOCUMENTS

| 54-162980 | 12/1979 | Japan | 357/23.7 |
| 55-67160 | 5/1980 | Japan | 357/23.7 |
| 57-27069 | 2/1982 | Japan | |

OTHER PUBLICATIONS

MacIver et al., "J-Mos: A Versatile Power Field-Effect Tansistor", *IEEE Electron Device Letters*, vol. ED-L-5, No. 5, May 1984, pp. 154-156.
Gallagher, "Silicon on Insulator Attains High Yields by Boundary Control," *Electronics*, May 5, 1983, pp. 85-86.

*Primary Examiner*—William A. Mintel
*Attorney, Agent, or Firm*—Steven R. Biren

[57] ABSTRACT

A semiconductor device includes a silicon layer of a first conductivity type, which is disposed on a dielectric substrate and in which at least two zones of a semiconductor circuit element of a second opposite conductivity type and a contact zone having the same conductivity type as, but a higher doping concentration than the silicon layer are provided, which zones adjoin a surface of the silicon layer. According to the invention, the contact zone extends below the zones of the field effect transistor. Thus, it is counteracted that at an interface of the silicon layer and the substrate a channel is formed which shortcircuits the zones. Moreover, the semiconductor device has a constant threshold voltage. This semiconductor device has the additional advantage that it can be manufactured in a very simple manner.

6 Claims, 5 Drawing Sheets

SILICON ON INSULATOR (SOI) SEMICONDUCTOR DEVICE

BACKGROUND OF THE INVENTION

The invention relates to a semiconductor device having a silicon layer of a first conductivity type, which is disposed on a dielectric substrate and in which at least two zones of a semiconductor circuit element of a second opposite conductivity type and a contact zone having the same conductivity type as, but a higher doping concentration than the silicon layer are provided, which zones adjoin at least substantially the surface of the silicon layer.

The invention further relates to a method of manufacturing such a semiconductor device.

Such a semiconductor device of the SOI (Silicon On Insulator) type has, in comparison with semiconductor devices having a semiconductor circuit element provided in a silicon substrate many advantages. A few of these advantages are the lower radiation sensitivity, a higher speed and a higher packing density (especially in three dimensional integrated circuits).

The semiconductor circuit element may be of many different types, such as, for example, a bipolar transistor, a thyristor and a field effect transistor. In all these types of semiconductor circuit elements, the invention can advantageously be used. However, the invention more particularly relates to a semiconductor device comprising as the semiconductor circuit element a field effect transistor, whose source and drain zones are the zones of the second conductivity type. The invention will therefore be described hereinafter mainly with reference to a semiconductor device comprising a field effect transistor as the semiconductor circuit element.

A Prior Art semiconductor device of the general kind mentioned above in which the semiconductor circuit element comprises a field effect transistor, is known from Japanese Kokai No. 57-27069. In the semiconductor device described therein, the substrate consists of sapphire, on which a p-doped monocrystalline silicon later is disposed. n+ doped source and drain zones of the field effect transistor are located in the silicon layer. In a region arranged laterally of the drain zone, the silicon layer has throughout its thickness a higher doping concentration than at the remaining areas. This region constitutes the contact zone, by means of which the silicon layer can be contacted at the surface.

By means of the contact zone, the silicon layer can be applied to a fixed potential. If a given fixed voltage is also applied to a gate electrode of the field effect transistor, there is a fixed potential difference between the gate electrode and the silicon layer. A given switching condition of the transistor is associated with this potential difference. When now the silicon layer is held at a fixed potential, the switching condition only depends upon the voltage applied to the gate electrode.

In the known semiconductor device described, a parasitic channel can be formed at an interface of the silicon layer and the substrate. This channel is obtained due to attraction of minority charge carriers from the silicon layer to the substrate. Especially in the case of a substrate of silicon oxide and a p-doped silicon layer disposed thereon, this phenomenon can occur. At the interface between the silicon oxide substrate and the silicon layer, a transitional region with regard to both crystal structure and stoichiometry from amorphous silicon oxide to crystalline silicon is present. In this region, a fixed positive charge can be formed in the silicon oxide. Due to this positive charge, electrons are attracted from the p-type silicon layer to the substrate, as a result of which a channel of electrons shortcircuiting the n-type zones of the semiconductor circuit element is formed in the silicon layer. However, also in the case of an n-doped silicon layer or in other crystal structures of the silicon, such a formation of a parasitic channel may occur, for example under the influence of conductors which are located below the semiconductor region and which have a different potential from that of the silicon layer, as a result of which holes or electrons are attracted from the silicon layer to the substrate. Due to the advancing integration and the reduction of semiconductor devices associated therewith, this channel formation gives rise to an increasingly more serious problem because it seriously affects adversely the operation of the semiconductor circuit element.

Furthermore, in a Prior Art semiconductor device of the kind mentioned above, a further problem can arise when the semiconductor circuit element comprises a field effect transistor. During operation of the transistor, in fact a potential is applied to a gate electrode of the transistor. As a result, a region in the silicon layer below the electrode becomes depleted. The size of this depleted region depends upon the voltage applied to the gate electrode and upon the doping concentration of the silicon layer. At a higher absolute value of the voltage, this region is generally larger. On the contrary, at a higher doping concentration, the depleted region can extend only over a smaller distance. With the integration on an increasingly larger scale of semiconductor circuit elements in semiconductor devices and the reduction associated therewith of the transistors themselves, the dimensions in the semiconductor device are meanwhile so small and especially the silicon layer has become so thin that it is possible for the depleted region to extend as far as the substrate. Due to the presence of the fixed positive charge in the transitional region or due to the presence of conductor tracks in the substrate, a surface potential at the interface can have a value different from that of the potential of the silicon layer, this surface potential moreover being unknown. If now the depleted region extends as far as this interface, the threshold voltage of the field effect transistor will be influenced by this surface potential, but the extent to which this will be the case is not known beforehand due to the unknown value of the surface potential. As a result, the operation of the transistor is anything but certain. This should of course be avoided.

SUMMARY OF THE INVENTION

The invention has for its object to provide a semiconductor device of the general kind mentioned above, in which the formation of the said parasitic channel is counteracted and in which it is further ensured that, when the semiconductor circuit element comprises a field effect transistor, the said depleted region cannot extend as far as the substrate.

In order to achieve this, according to the invention, a semiconductor device of the general kind mentioned above is characterized in that the contact zone extends below the zones of the semiconductor circuit element of the second conductivity type. When the contact zone is applied to a given fixed voltage, because the contact zone extends between the zones of the semiconductor circuit element and the interface, a field can be built up in situ which compensates for the field corresponding to the surface potential. Thus, the minority charge carriers in the silicon layers are no longer subjected to an attracting effect of the substrate so that the formation of the parasitic channel is counteracted. Moreover, the more highly doped contact zone forms—due to its high doping concentration—in case the semiconductor circuit element is a field effect transistor a boundary for the said depleted region in the silicon layer, as a result of which this region cannot extend as far as the interface and the threshold voltage is not influenced by the surface potential at the interface. When the contact zone is applied to a fixed potential, it is achieved that the threshold voltage has a fixed previously known value.

The silicon layer will often be surrounded by an insulation region of silicon oxide in order to insulate the semiconductor circuit element from its surroundings. The said problems may also arise at an interface between the silicon layer and the insulation region in the same manner as at the interface between the silicon layer and the subjacent substrate. It is a unexpected to find that these problems are also counteracted when in the semiconductor device the contact zone according to the invention entirely encloses the semiconductor circuit element in the silicon layer.

A preferred embodiment of the semiconductor device is characterized in that the contact zone comprises an implanted zone, which adjoins the surface beside the zones of the semiconductor circuit element and is located from this surface in the direction of the zones at a gradually larger depth in the silicon layer. A great advantage of this embodiment is, besides favorable contacting properties of the contact zone, that it can be manufactured in a simple manner. This will appear further below.

A particular embodiment of the semiconductor device according to the invention is characterized in that the semiconductor circuit element comprises a field effect transistor having source and drain zones of the second conductivity type located in the silicon layer and in that the contact zone adjoins the subjacent substrate. As stated, the contact zone forms a boundary for the depleted region so that the latter cannot extend as far as the interface. On the other hand, it is desirable that the depleted region extends at a largest possible depth into the silicon layer. In fact a capacitance corresponds to the substantially non-conducting depleted region between the gate electrode and the highly conductive contact zone. Accordingly as the depleted region can extend to a larger depth into the silicon layer, the value of this capacitance is smaller. Accordingly as the value of the capacitance is smaller, the field effect transistor operates at a higher speed, which is desirable. If the contact zone adjoins the substrate, the depleted region can extend to the largest depth into the silicon layer, as a result of which the speed of the transistor is favorable influenced.

A method of manufacturing a semiconductor device of the kind mentioned above in which in a silicon layer disposed on a dielectric substrate and having a first conductivity type a contact zone having the same conductivity type as, but having a higher doping concentration than the silicon layer and at least two zones of a semiconductor circuit element having a second opposite conductivity type are formed, which zones adjoin a surface of the silicon layer, is characterized according to the invention in that the silicon layer is locally covered with a masking layer, in that an edge portion of the masking layer adjoining a part of the silicon layer not covered by the masking layer is bevelled, in that the contact zone, while being masked by the masking layer, is formed by ion implantation, an energy of the implantation and a thickness of the masking layer being tuned to each other so that the contact zone in the part of the silicon layer not covered by the masking layer extends below a semiconductor region, is located below the edge portion at a gradually higher level in the silicon layer and adjoins the surface below a remaining part of the masking layer, and in that in the semiconductor region the zones of the semiconductor circuit element are formed. Thus, the bevelled edge portion is effectively imaged in the silicon layer in the form of the contact zone. As a result, in a surprisingly simple manner a gradual transition is obtained from the part of the contact zone located below the semiconductor region to the part located at the surface.

A preferred embodiment of the method according to the invention is characterized in that the masking layer comprises a photoresist layer and in that the edge portion is bevelled by subjecting the photoresist layer to a thermal treatment. Due to this thermal treatment, the photoresist layer flows out a little, as a result of which the edge portion is bevelled so that the photoresist layer is particularly suitable to be used as an implantation mask for the contact zone.

A particular embodiment of the method, in which the semiconductor circuit element comprises a field effect transistor having source and drain zones of the second conductivity type, is characterized according to the invention in that, before the masking layer is provided, the silicon layer is covered by a silicon oxide layer, in that a part of the silicon oxide layer not covered by the masking layer, while being masked by the masking layer, is etched away, in that above the semiconductor region a gate electrode of the field effect transistor is formed, and in that in the semiconductor region the source and drain zones are formed by implantation, the gate electrode as well as the silicon oxide layer masking against this implantation. By the combined use of the masking layer as implantation mask for the contact zone and as etching mask for the silicon oxide layer, which silicon oxide layer is then used as an implantation mask for the source and drain zones, the source and drain zones are formed in a self-aligned manner with respect to the contact zone. Due to the masking effect of the gate electrode, the source and drain zones are moreover formed in a self-aligned manner with respect to the gate electrode. Thus, the source and drain zones are always located accurately in the correct position with respect to both the contact zone and the gate electrode. This structure is therefore sometimes designated as a double self-aligned structure. Thus, an additional mask with an associated alignment step, which is very critical, is then eliminated.

BRIEF DESCRIPTION OF THE DRAWINGS

The invention will now be described more fully, by way of example, with reference to the drawing. In this embodiment and in the drawing, the semiconductor circuit element comprises a field effect transistor, but, as stated above, the invention may advantageously be used in semiconductor devices comprising other types of semiconductor circuit elements, such as, for example, bipolar transistors and thyristors. In the drawing.

The Figures are schematic and not drawn to scale. For the sake of clarity, certain dimensions are greatly exaggerated. Corresponding parts are generally designated by like reference numerals. Semiconductor zones of the same conductivity type are generally cross-hatched in cross-section in the same direction.

DESCRIPTION OF THE PREFERRED EMBODIMENTS

Figure 1:
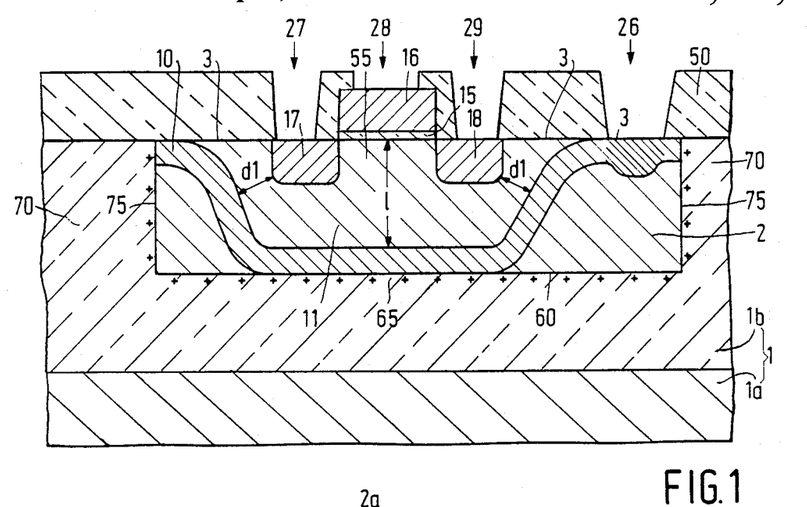
FIG. 1 shows diagrammatically in cross-section an embodiment of the semiconductor device according to the invention.
Figure 2:
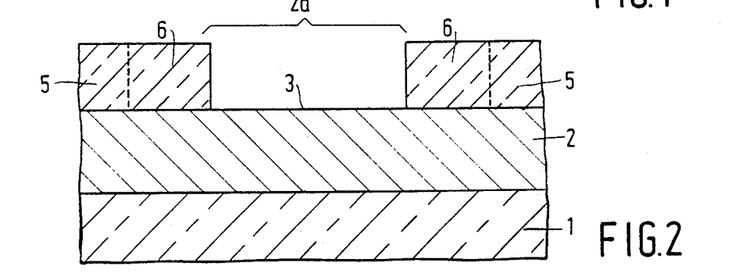
FIGS. 2 to 7 show diagrammatically in cross-section a semiconductor device at successive stages of manufacture by means of an embodiment of the method according to the invention.
Figure 3:
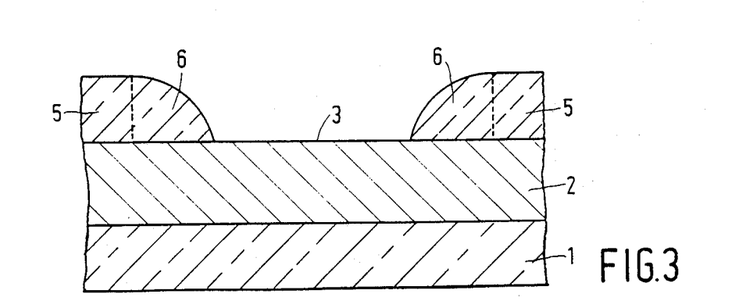
Figure 4:
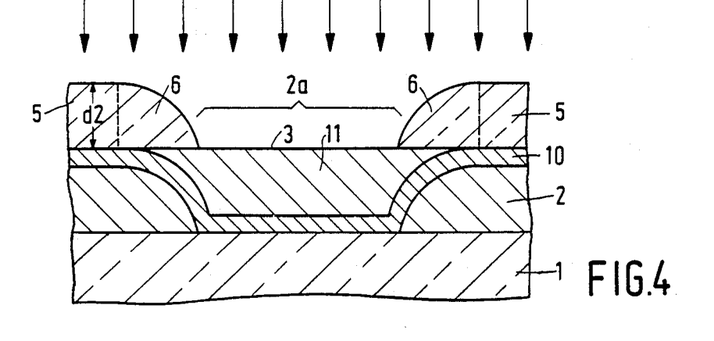

FIG. 1 shows diagrammatically in cross-section an embodiment of the semiconductor device according to the invention. In this case, the semiconductor device comprises a dielectric substrate 1 having a base layer 1a of silicon and a top layer 1b of silicon oxide. An approximately 0.5 μm thick monocrystalline silicon layer 2 of a first conductivity type, in this case p-type, is disposed on the substrate 1. A contact zone 10 having the same conductivity type as, but a higher doping concentration than the silicon layer 2 is present in the silicon layer 2. In this embodiment, the acceptor concentration in the silicon layer is about $5.10^{15}$ cm$^{-3}$ and this concentration is in the contact zone approximately $5.10^{18}$ cm$^{-3}$. n-type source and drain zones 17 and 18, respectively, of a field effect transistor are further provided in the p-type silicon layer. Both the contact zone 10 and the source and drain zones 17 and 18, respectively, adjoin a surface 3 of the silicon layer. A layer of gate oxide 15 and a gate electrode 16 for controlling the transistor are disposed on the silicon layer 2. The assembly is covered by an insulating layer 50, in which contact windows 26 to 29 are provided to contact the gate electrode 16, the contact zone 10 and the source and drain zones 17 and 18, respectively.

By means of the contact zone 10, the silicon layer can be applied to a fixed potential. If a given fixed voltage is applied to the gate electrode 16 of the field effect transistor, there is a fixed potential difference between the gate electrode 16 and the silicon layer 2. A given switching condition of the transistor is associated with this potential difference. When the silicon layer 2 is held at a fixed potential, the switching condition only depends upon the voltage applied to the gate electrode 16.

A transitional region 65 from amorphous silicon oxide to monocrystalline silicon is present at the interface 60 between the monocrystalline silicon layer 2 and the subjacent silicon oxide of the substrate 1. In this region both a stoichiometric transition from SiO$_2$ to Si and a structure transition from an amorphous structure to a monocrystalline structure are obtained. This region 65 extends to about 30 Å into the top layer 1b of the substrate. Due to the stoichiometric transition, this region contains fixed, mostly positive charge, indicated in the Figure by "+" symbols. This charge has a surface density of approximately $10^9$ to $10^{12}$ cm$^{-2}$. Due to this charge, electrons are attracted from the silicon layer 2 to the interface 60, at which they could be collected to form a parasitic channel, which short-circuits the source and drain zones 17 and 18, respectively. According to the invention, the contact zone 10 extends below the source and drain zones 17 and 18, respectively, of the field effect transistor. When the contact zone is applied to a given fixed voltage, an electric field can be built up here, which compensates for the electric field due to the surface potential, as a result of which the electrons are no longer attracted by the substrate and a channel of the kind described above cannot be formed. It should be noted that in this case channel formation with a p-type monocrystalline silicon layer 2 and positive charge at the surface 60 is described only by way of example, but that such a channel formation may also occur if the silicon layer 2 is of the n-type or has a different crystal structure. If use is made of an n-type silicon layer 2, it should be considered that the parasitic channel is then a channel of holes. These holes may be attracted, for example, to the interface 60 due to the fact that the interface 60 has a negative potential with respect to the silicon layer 2 due to any conductor tracks in the top layer 1b.

The fact that the contact zone 10 extends according to the invention below the source and drain zones 17 and 18, respectively, of the field effect transistor still has another advantage, however. During operation of the transistor, in fact a potential will be applied to the gate electrode 16. As a result, in the silicon layer a region 55 below the electrode 16 becomes depleted, that is to say that charge carriers are expelled therefrom. The size of this region generally depends upon the voltage applied to the gate electrode 16 and upon the doping concentration in the silicon layer 2. As the applied voltage becomes larger, the depleted region 55 also becomes larger; on the contrary, as the doping concentration is larger, however the depleted region 55 can extend over a smaller distance. Due to the fact that the contact zone 10, doped more highly than the silicon layer 2, extends according to the invention below the source and drain zones 17 and 18, respectively, of the field effect transistor, the contact zone 10 forms a boundary for said depleted region 55. As a result, the depleted region 55 cannot extend as far as the substrate 1. Especially with thin-film transistors, such as, for example, SOI transistors, the silicon layer 2 has such a small thickness that this would otherwise be possible. This would then result in that in that case the threshold voltage of the transistor is influenced by a surface potential at the interface 60 between the silicon layer 2 and the substrate 1. Due to the fact that this surface potential is not known previously and moreover can have a constantly varying value, the operation of the transistor would thus be anything but certain. When the contact zone 10 is applied to a given fixed voltage, it is achieved that the threshold voltage is not influenced by the surface potential and has a fixed known value.

In this embodiment, according to the invention, the contact zone 10 entirely encloses the field effect transistor in the silicon layer 2. In many cases, the silicon layer 2 is in fact enclosed by an insulation region 70 of silicon oxide, as a result of which the layer 2 is electrically insulated from any other silicon layers present on the substrate. In this case, a parasitic channel shortcircuiting the source and drain zones 17 and 18, respectively, of the field effect transistor could be formed also at an interface 75 between the silicon layer 2 and the surrounding insulation region 70 in the same manner as at the interface between the silicon layer 2 and the subjacent substrate 1, while the threshold voltage could be influenced by a surface potential at said interface 75. However, due to the fact that the contact zone 10 entirely encloses the field effect transistor in the silicon layer 2, these problems are counteracted in the same manner as described above.

In the embodiment of the semiconductor device shown in FIG. 1, the contact zone 10 adjoins according to the invention the subjacent substrate 1. During operation of the transistor, the depleted region 55 will in fact extend in the silicon layer 2. Substantially all charge carriers are expelled from the depleted region 55 so that this region can be considered as a dielectric. As already stated, the depleted region can extend at most to the contact zone. In this case, the dielectric depleted region is adjoined on one side by the conducting contact zone 10 and on an opposite side by a conducting gate electrode 16. Thus, the depleted region corresponds to a capacitance whose value is approximately inversely proportional to the depth 1 over which the depleted region extends in the silicon layer and in this case therefore the depth at which the contact zone 10 is located in the silicon layer. Accordingly as the depth is made larger, the capacitance is becomes smaller and hence the field effect transistor has a higher speed.

The contact zone 10 can be obtained both by diffusion and by ion implantation. According to the invention, the contact zone 10 comprises, however, an implanted zone, which adjoins beside the source zone 17 and the drain zone 18 the surface 3 of the silicon layer 2 and is located therefrom at a gradually larger depth in the silicon layer 2. As will appear below, this embodiment of the semiconductor device can be manufactured in a particularly simple manner.

In general, both the zones 17 and 18 of the semiconductor circuit element and the contact zone 10 will have a comparatively high doping concentration. Therefore, a certain space must be present between the contact zone 10 on the one hand and the source and drain zones 17 and 18, respectively, on the other hand to counteract voltage breakdown phenomena which are due to large potential differences between the contact zone and the zones of the semiconductor circuit element occurring during operation of the semiconductor circuit element. It has been found that such voltage breakdown phenomena do not occur at practically usual operating voltages of the transistor if the distance d1 according to the invention between the source and drain zones 17 and 18, respectively, on the one hand and the contact zone 10 on the other hand is larger than 0.35 $\mu$m.

According to the invention, the contact zone 10 further has at the surface 3 locally a higher doping concentration than at other areas; this is indicated in the figure by a finer cross-hatching of the contact zone 10 in situ. As already stated, the contact zone is obtained by ion implantation. In practice, however, it is not possible to implant a sharply defined contact zone, but in the contact zone the doping concentration will increase from a background concentration of the silicon layer to a certain maximum doping concentration. If the contact zone does not exhibit this maximum doping concentration at the surface 33, a satisfactory contacting can nevertheless be attained in this region due to the fact that according to the invention the contact zone 10 locally has a higher doping concentration at the surface 3.

With reference to FIGS. 2 to 8, an embodiment of the method according to the invention will now be described more fully.

The starting material (see FIG. 2) is a monocrystalline silicon layer 2 of a first conductivity type, in this embodiment p-type, having a surface 3 and disposed on a dielectric substrate 1. The substrate is made in this embodiment of silicon oxide. The silicon layer 2 disposed thereon has a thickness of, for example, 0.5 $\mu$m and a doping concentration of approximately $5.10^{15}$ cm$^{-3}$. At a later stage, a contact zone having the same conductivity type as, but a higher doping concentration than the silicon layer 2 and source and drain zones of a field effect transistor of a second opposite conductivity type are formed in the silicon layer 2 in such a manner that the said zones adjoin the surface 3. For this purpose, according to the invention, the silicon layer 2 is locally covered by a masking layer 5. The masking layer 5 is patterned in a usual manner so that a part 2a of the silicon layer 2 is not covered thereby. The masking layer 5 adjoins this uncovered part 2a of the silicon layer 2 with an edge portion 6 (cf. FIG. 8).

According to the invention, the edge portion 6 of the masking layer 5 adjoining the part 2a of the silicon layer 2 not covered by the masking layer 5 is then bevelled. Preferably, according to the invention, a photolacquer layer is used as a masking layer 5. In this embodiment, for this purpose use is made of a layer of the photolacquer HPR 204 marketed by Hunt. It should be noted, however, that within the scope of the invention other kinds of layers and other photolacquer layers may also be used. When another layer is used as a masking layer, in many cases another oblique form of the bevelled edge portion will be obtained, which may be desirable in given circumstances. The edge portion 6 of the photolacquer layer 5 is bevelled according to the invention in that the photolacquer layer 5 is subjected to a thermal treatment. For this purpose, the assembly is arranged in a furnace for 30 minutes at a temperature of approximately 145° C. Due to the increased temperature, the photolacquer layer 5 will flow out a little and will assume under the influence of its surface tension in the edge portion 6 the desired bevelled form (cf. FIG. 3).

Subsequently, according to the invention, while masking by the masking layer 5, a p-type contact zone 10 is formed in the silicon layer 2 by ion implantation. With this implantation, an energy thereof, i.e. of the ions to be implanted, and a thickness d2 of the masking layer are tuned to each other in such a manner that the contact zone 10 in the part 2a of the silicon layer 2 not covered by the masking layer 5 extends below a semiconductor region 11, is located below the edge portion 6 at a gradually higher level in the silicon layer 2 and adjoins the surface 3 below a remaining part of the masking layer 5 (cf. FIG. 4). In this embodiment, the implantation is carried out with boron ions having an energy of about 240 keV and a dose of approximately $10^{13}$ cm$^{-2}$. The masking layer 5, which is formed in this embodiment by a photolacquer layer, has a thickness d2 of approximately 1.9 $\mu$m. Due to the fact that the edge portion 6 is bevelled, the thickness of the masking layer gradually decreases in situ, as a result of which a masking effect of the masking layer also decreases and the contact zone 10 is formed at a larger depth in the silicon layer. Thus, the masking layer 5 and especially the oblique edge portion 6 thereof is effectively imaged in the form of the contact zone 10 in the silicon layer 2. Due to a gradual variation of the thickness of the bevelled part 6 of the masking layer, a gradual transition is obtained in the contact zone 10 from the part adjoining the surface 3 to the part extending below the semiconductor region 11. Thus, in a simple manner a continuous contact zone 10 is obtained, which permits a satisfactory contacting of the silicon layer and by which moreover the objects to be achieved in accordance with the invention are realized.

Figure 5:
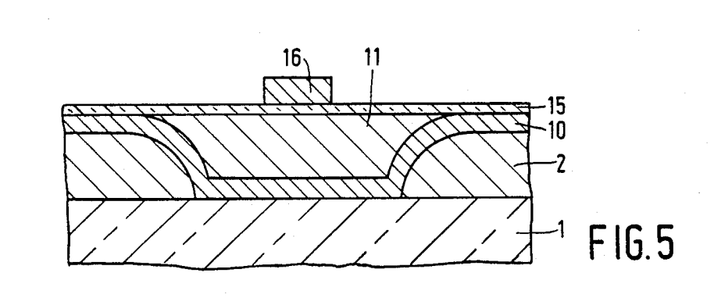

Subsequently, the masking layer 5 is removed and the silicon layer 2 is covered by thermal oxidation with an approximately 50 nm thick layer of gate oxide 15, whereupon above the semiconductor region 11 a gate electrode 16 is formed from polycrystalline silicon on the gate oxide 15 (cf. FIG. 5).

Figure 6:
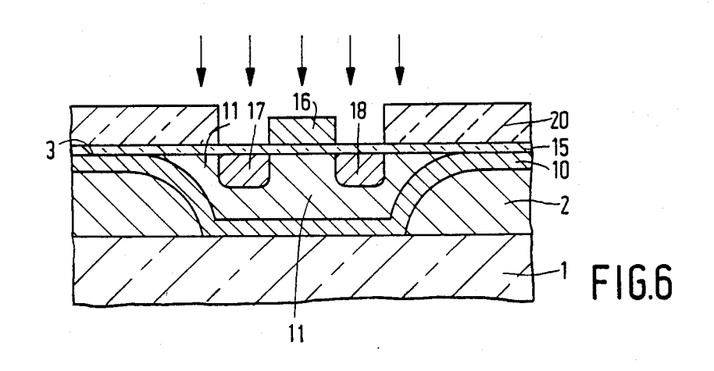

The assembly is then covered by a second photolacquer layer 20, which is patterned in a usual manner so that a part of the gate oxide layer 15 is not covered thereby (cf. FIG. 6). Subsequently, according to the invention, the source and drain zones 17 and 18, respectively, of the field effect transistor, which adjoin the surface 3 of the silicon layer 2, are formed in the semiconductor region 11. For this purpose, in this case an implantation of arsenic ions having an energy of about 100 keV and a dose of about $5.10^{15}$ cm$^2$ is carried out, both the photolacquer layer 5 and the gate electrode 16 masking against this implantation (cf. FIG. 6).

Figure 7:
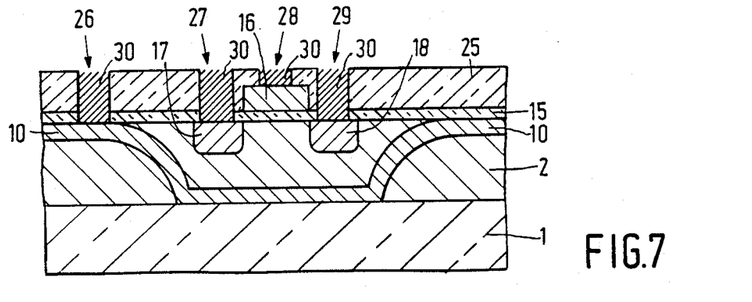
Figure 8:
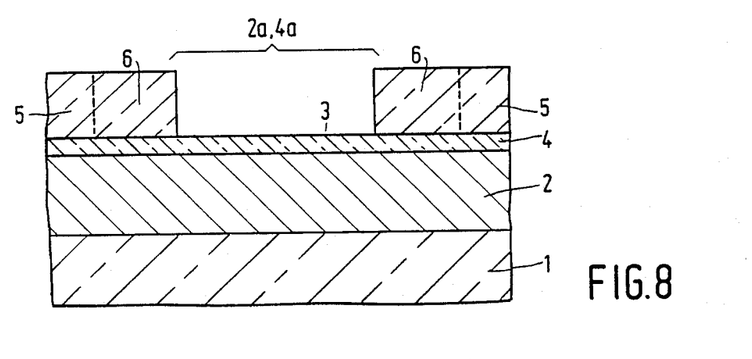
FIGS. 8 to 12 show diagrammatically in cross-section a semiconductor device at successive stages of manufacture by means of another embodiment of the method according to the invention.

An approximately 0.5 $\mu$m thick silicon oxide layer 25 is then formed on the assembly, for example, by depositing the layer from a gas mixture of tetraethyl orthosilicate at a reduced pressure. Subsequently, in a usual manner contact windows 26 to 29 are etched into the silicon oxide layer 25 and the underlying gate oxide 15 and these windows are then filled with a contact metallization 30 in order to contact the gate electrode 16, the contact zone 10 and the source and drain zones 17 and 18, respectively. For this purpose, for example, an approximately 1.1 $\mu$m thick layer of aluminum can be applied by sputtering to the assembly and this layer can subsequently be etched into a desired pattern. Thus, the situation of FIG. 7 is obtained.

A particular embodiment is illustrated with reference to FIGS. 8 to 12. The starting material is again a p-type monocrystalline silicon layer 2 having a surface 3 and disposed on a silicon oxide substrate 1. The silicon layer 2 is covered by thermal oxidation with an approximately 0.13 $\mu$m thick layer of silicon oxide 4 (cf. FIG. 8). This oxidation is carried out, for example, for 1 hour in an atmosphere of steam at a temperature of about 900° C. Subsequently, the silicon oxide layer 4 is locally covered in accordance with the invention with a masking layer 5. The masking layer 5 is patterned for this purpose in a usual manner so that a part 2a of the silicon layer 2 and a part 4a of the silicon oxide layer 4 located above it are not covered thereby (cf. FIG. 8).

Figure 9:
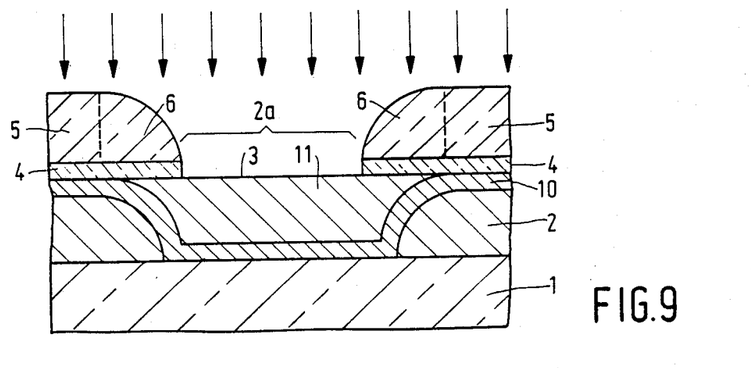
Figure 10:
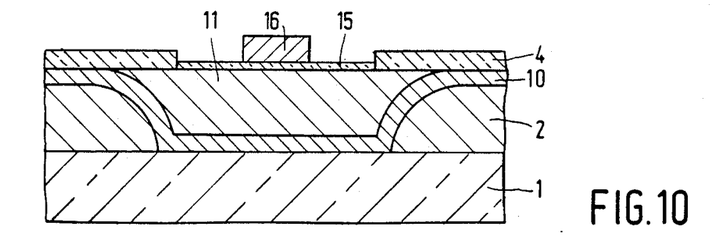

Subsequently, according to the invention, an edge portion 6 of the masking layer is bevelled while being masked by the masking layer 5, a p-type contact zone 10 is formed in the silicon layer by implantation of boron ions and the part 4a of the silicon oxide layer 4 is etched away while being masked by the masking layer 5 so that the situation of FIG. 9 is obtained. The contact zone 10 adjoins the surface 3 of the silicon layer and extends below a semiconductor region 11, in which at a later stage source and drain zones of a file effect transistor are formed. The boron ions are implanted in this embodiment at an energy of about 240 keV and a dose of about $10^{13}$ cm$^{-2}$. By the said etching step, the pattern of the masking layer 5 is transferred to the silicon oxide layer 4.

Subsequently, the masking layer 5 is removed and an approximately 50 nm thick layer of gate oxide 15 is deposited by thermal oxidation on the uncovered part 2a of the silicon layer 2. The assembly is then covered with a layer of polycrystalline silicon, which is subsequently doped with phosphorus, as a result of which the layer becomes electrically good conducting. From the polycrystalline silicon layer, according to the invention, a gate electrode 16 is formed by masking and etching above the semiconductor region 11 (cf. FIG. 10).

Subsequently, according to the invention, the source and drain zones 17 and 18, respectively, (cf. FIG. 11) of the field effect transistor are formed in the semiconductor region 11. For this purpose, according to the invention, an implantation with arsenic ions is carried out, against which both the gate electrode 16 and the silicon oxide layer 4 mask. In this embodiment, the arsenic ions are implanted at an energy of about 100 keV and a dose of about $5.10^{15}$ cm$^{-2}$. Due to the masking effect of the gate electrode 16, the source and drain zones 17 and 18, respectively, are formed in a self-aligned manner with respect thereto, while the zones 17 and 18 are also formed in a self-aligned manner with respect to the contact zone 10 due to the masking effect of the silicon layer. In fact, as already stated above, the pattern of the masking layer 5, which is used as a mask while forming the contact zone 10 in the silicon layer 2, is transferred by the use of the masking layer 5 as an etching mask for the silicon oxide layer 4 to the silicon oxide layer 4. In this connection, the term "double self-aligned" structure is sometimes used (cf. FIG. 11). An advantage of this embodiment of the method is that now the use of a second photolacquer layer, as described in the preceding embodiment, and a fairly critical alignment step of the mask then required are avoided.

Figure 12:
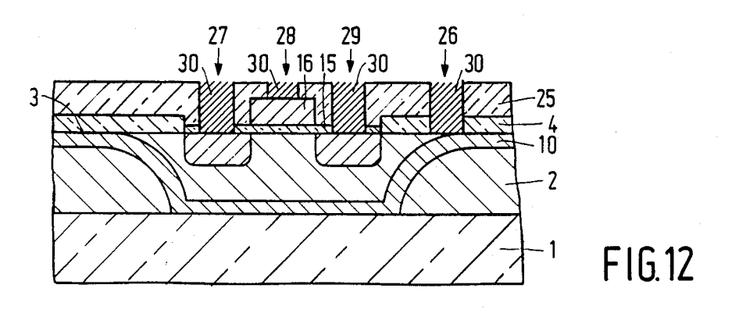

Subsequently, in the manner already described above, the assembly is covered with a silicon oxide layer 25, while contact windows 26 to 29 are etched into this layer and into the subjacent silicon oxide layer 4 or 15 in a usual manner, whereupon the contact windows 26 to 29 are filled with a contact metallization 30 so that the situation of FIG. 12 is obtained.

A third embodiment of the method according to the invention will now be described more fully with reference to FIGS. 13 and 14. In this embodiment, the starting point is FIG. 11, although the following steps may also be used starting from FIG. 6.

Figure 11:
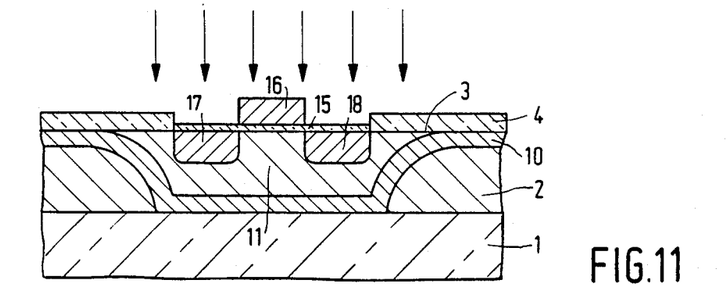
Figure 13:
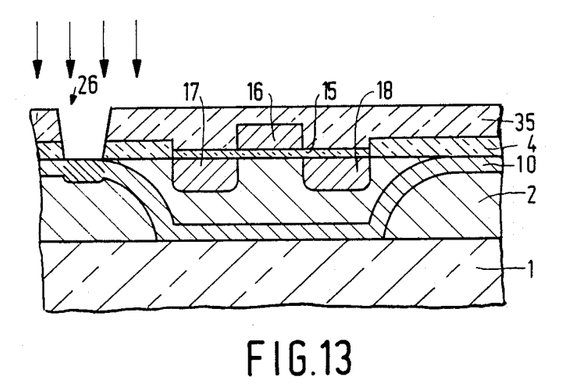
FIGS. 13 and 14 show diagrammatically in cross-section a semiconductor device at successive stages of manufacture by means of a third embodiment of the method according to the invention.
Figure 14:
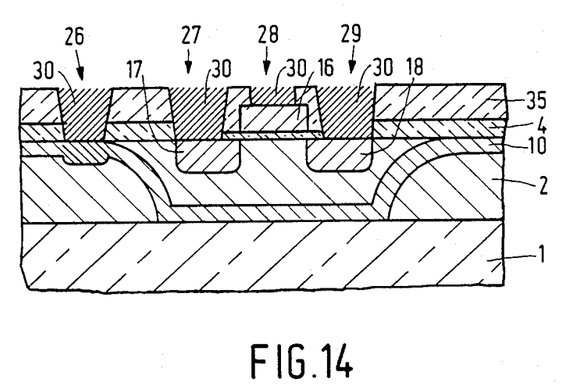

After the situation of FIG. 11 has been obtained, an insulating layer 35 is provided on the assembly (cf. FIG. 13). In this embodiment, for this purpose and approximately 0.5 $\mu$m thick silicon oxide layer is used. Subsequently, according to the invention, a contact window 26 is etched in a usual manner into the silicon oxide layer 25 and into the underlying silicon oxide layer 4 above a part of the contact zone 10 adjoining the surface 3. According to the invention, an implantation with boron ions is then carried out over the assembly at an energy of about 30 keV and a dose of, for example, $3.10^{15}$ cm$^{-2}$, as a result of which the doping concentration in the contact zone 10 at the area of the contact window 26 becomes higher than at other areas. This high doping concentration is indicated in FIG. 13 by a finer cross-hatching.

Subsequently, contact windows 27 to 29 are etched into the insulating layer also above the gate electrode 16 and the source and drain zones 17 and 18, respectively, after which all contact windows 26 to 29 are filled with a contact metallization 30 by applying by sputtering an approximately 1.1 μm thick aluminum layer to the assembly and etching the latter into a desired pattern. Thus, the configuration shown in FIG. 14 is obtained.

It should be appreciated that within the scope of the invention many further variations are possible for those skilled in the art, so that many other semiconductor devices may be manufactured by the use of the invention. Thus, in general, in the embodiments described, the conductivity types may be replaced (all simultaneously) by the opposite types. Further, the said insulating layer, the said dielectric substrate and the said masking layer may also be replaced by other layers without departing from the scope of the invention. In general sense, the invention is of major importance for semiconductor devices in which a semiconductor circuit element is formed in a silicon layer disposed on a dielectric substrate.

What is claimed is:

1. A semiconductor device comprising a dielectric substrate, a silicon layer of a first conductivity type disposed on said dielectric substrate, at least two zones of a semiconductor circuit component of a second opposite conductivity type and a contact zone for contacting the silicon layer and having the same conductivity type as, but a higher doping concentration than that of the silicon layer, provided in said silicon layer, which zones at least substantially adjoin the surface of the silicon layer, characterized in that the contact zone extends below and is spaced apart from the zones of the semiconductor circuit component of the second conductivity type.

2. A semiconductor device as claimed in claim 1, characterized in that the contact zone entirely encloses the semiconductor circuit component in the silicon layer.

3. A semiconductor device as claimed in claim 1, or 2, characterized in that the contact zone comprises an implanted zone which adjoins the surface beside the zones of the semiconductor circuit component and is located from this surface in the direction of the zones at a gradually increasing depth in the silicon layer.

4. A semiconductor device as claimed in claim 1 or 2, characterized in that the semiconductor circuit component comprises a field effect transistor and said zones comprise source and drain zones of the second conductivity type located in the silicon layer, and in that the contact zone adjoins the subjacent underlying substrate.

5. A semiconductor device as claimed in claim 4, characterized in that the smallest distance between the source and drain zones and the contact zone is larger than 0.35 μm.

6. A semiconductor device as claimed in claim 1 or 2, characterized in that the contact zone has a higher local doping concentration at the surface than at other areas.

* * * * *